United States Patent
Fang et al.

(10) Patent No.: US 7,256,652 B1
(45) Date of Patent: Aug. 14, 2007

(54) DIFFERENTIAL INPUT RECEIVER HAVING OVER-VOLTAGE PROTECTION

(75) Inventors: Emerson S. Fang, Fremont, CA (US); Thomas J. Hirsch, Austin, TX (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 152 days.

(21) Appl. No.: 11/221,643

(22) Filed: Sep. 8, 2005

(51) Int. Cl.
*H03F 3/45* (2006.01)

(52) U.S. Cl. .................................. 330/253; 330/298

(58) Field of Classification Search ................ 330/253, 330/298, 261, 277; 327/359
See application file for complete search history.

(56) References Cited

U.S. PATENT DOCUMENTS

| | | | |
|---|---|---|---|
| 4,785,258 A * | 11/1988 | Westwick | 330/253 |
| 6,828,856 B2 * | 12/2004 | Sanchez et al. | 330/253 |
| 6,831,513 B2 * | 12/2004 | Matsumoto et al. | 330/253 |
| 6,870,424 B2 | 3/2005 | Pradhan et al. | |
| 6,933,752 B2 | 8/2005 | Dreps et al. | |
| 6,970,043 B2 | 11/2005 | Pradhan et al. | |

* cited by examiner

*Primary Examiner*—Henry Choe
(74) *Attorney, Agent, or Firm*—Meyertons Hood Kivlin Kowert & Goetzel, P.C.; Erik A. Heter

(57) ABSTRACT

A differential receiver circuit. In one embodiment, the circuit includes first and second input transistors, each having a first terminal coupled to a bias node (a first and second bias node, respectively), as well as first and second bias transistors, each having a first terminal coupled to the first and second bias nodes, respectively. The circuit further includes a first current source coupled to provide current to the first bias node and a second current source coupled to the second bias node. The differential receiver circuit is coupled to first and second, which receive first and second voltages, respectively. The first and second current sources provide current to the first and second bias nodes, respectively, such that the voltage present on the first and second bias nodes remains with approximately a threshold voltage of a midpoint between the voltages present on the first and second voltage nodes.

31 Claims, 2 Drawing Sheets

DIFFERENTIAL INPUT RECEIVER HAVING OVER-VOLTAGE PROTECTION

BACKGROUND OF THE INVENTION

1. Field of the Invention

This invention relates to electronic systems, and more particularly, to receiver circuits in electronic systems.

2. Description of the Related Art

In computers and other electronic systems, the demand for speed is ever increasing. One method for increasing speed is to reduce the required voltage to operate devices within the circuits of the electronic systems. Lower voltages typically lead to shorter rise times. Thus, in many electronic systems, the trend is towards lower voltage transistors, which may have faster switching times than their higher voltage counterparts. However, transistors designed for lower voltages typically are not rated to tolerate higher voltage swings.

In some instances, the need of higher operating speeds may be in conflict with certain specifications. For example, voltage requirements for specifications such as the DDR2 (Double Data Rate 2) memory specification requires a voltage swing of 1.8 volts between logic high and logic low signals. Thus, typical transmitters and receivers used in subsystems conforming to the DDR2 may employ transistors rated at 1.8 volts that may be unable to operate with the switching speeds as fast as transistors having lower voltage ratings (e.g., 1.2 volts).

SUMMARY OF THE INVENTION

A differential receiver circuit is disclosed. In one embodiment, the circuit includes first and second input transistors, each having a first terminal coupled to a bias node (a first and second bias node, respectively), as well as first and second bias transistors, each having a first terminal coupled to the first and second bias nodes, respectively. The circuit further includes a first current source coupled to provide current to the first bias node and a second current source coupled to the second bias node. The differential receiver circuit is coupled to first and second, which receive first and second voltages, respectively. The first and second current sources provide current to the first and second bias nodes, respectively, such that the voltage present on the first and second bias nodes remains with approximately a threshold voltage of a midpoint between the voltages present on the first and second voltage nodes.

In one embodiment, the maximum rated voltage difference across any transistor in the differential receiver circuit is less than the difference between the voltage of the first voltage node and the voltage of the second voltage node. For example, in an embodiment using PMOS or NMOS transistors, the rated gate-source voltage may be less than the voltage swing between the first and second voltage nodes. Thus, the maximum voltage swing of input signals conveyed to the receiver circuit may exceed the rated voltage of the input transistors without damaging the circuit. The voltages present on the first and second voltage nodes, and one of these nodes may be a reference (i.e. ground node). In some embodiments, the voltage present on the first voltage node may be greater than the voltage present on the second voltage node, while in other embodiments, the voltage present on the first voltage node may be less than the voltage present on the second voltage node.

BRIEF DESCRIPTION OF THE DRAWINGS

Other aspects of the invention will become apparent upon reading the following detailed description and upon reference to the accompanying drawings in which.

Figure 1:
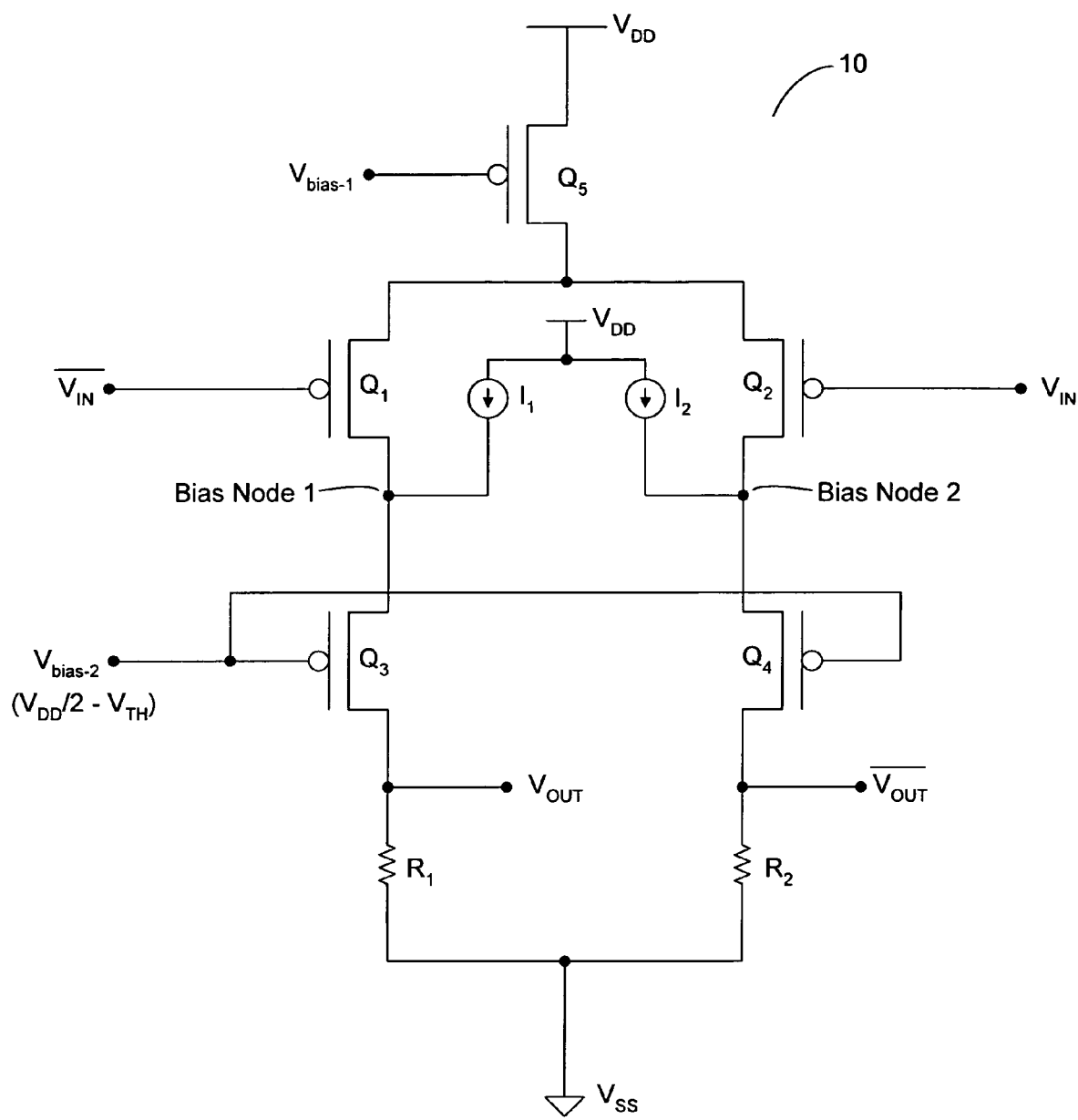
FIG. 1 is a schematic diagram of one embodiment of a receiver circuit.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

DETAILED DESCRIPTION OF THE INVENTION

Turning now to FIG. 1, a schematic diagram of one embodiment of a receiver circuit. In the embodiment shown, receiver circuit 10 is a differential receiver circuit. Receiver circuit 10 includes a first input transistor $Q_1$ and a second input transistor $Q_2$. Receiver circuit 10 is configured to receive a differential input signal through input transistors $Q_1$ and $Q_2$, wherein the signal received on the gate of transistor $Q_1$ is the complement of the signal received on the gate of transistor $Q_2$.

Receiver circuit 10 also includes first and second bias transistors, $Q_3$ and $Q_4$, respectively. The gate terminals of bias transistors $Q_3$ and $Q_4$ are each coupled to receive a bias voltage, $V_{bias-2}$. In the embodiment shown, this bias voltage is approximately a voltage $V_{DD}/2-V_{TH}$, wherein $V_{DD}$ is a power supply voltage and $V_{TH}$ is the threshold voltage for turning on or turning off transistors (i.e. the required gate-source voltage for turning on the transistors, which is a minimum value of $V_{GS}$) in receiver circuit 10. While embodiments of receiver circuit 10 are possible and contemplated wherein transistors having different threshold voltages are used, for the purposes of this disclosure, it is assumed that each of the transistors in receiver circuit 10 have the same rated threshold voltage. It should be noted that in this embodiment, the value of $V_{DD}$ is referenced to the potential on the voltage node $V_{SS}$. In general, voltage nodes $V_{DD}$ and $V_{SS}$ may be different relative to one another in other embodiments of differential receiver circuit 10, as will be discussed below. In general, the bias voltage is at a midpoint between the first voltage node ($V_{DD}$ in this case) and the second voltage node ($V_{SS}$ in this case), plus or minus the threshold voltage $V_{TH}$, depending on the polarity of $V_{DD}$ to $V_{SS}$.

First and second current sources $I_1$ and $I_2$ are also part of receiver circuit 10. The output of current sources $I_1$ and $I_2$ are coupled, respectively, to a first bias node (bias node 1) and a second bias node (bias node 2). Each of the bias nodes also includes a junction between an input transistor and a bias transistor (e.g., the drain terminals of the input transistors and the source terminals of the bias transistors in the embodiment of FIG. 1). Each of current sources $I_1$ and $I_2$ are configured to provide current to their respective bias nodes in order to keep the voltage on these nodes within approximately a threshold voltage (e.g., $V_{TH}$ as discussed above) of a midpoint between the voltage present on a first voltage node (e.g., $V_{DD}$) and the voltage present on a second voltage node (e.g., $V_{SS}$). Thus, for the embodiment shown, if the first voltage node $V_{DD}$ has a voltage provided by a voltage source (e.g., a power supply) and voltage node $V_{SS}$ is a reference node (e.g., ground), the voltage present on the bias node will be within (plus or minus) approximately a threshold voltage of $V_{DD}/2$.

Since the current sources provide current in order to maintain a voltage on the bias nodes that is within approximately $V_{TH}$ of a midpoint between the first and second voltage nodes, the rated voltages for the transistors of receiver circuit 10 may be less than the difference in the voltages present on the first and second voltage nodes. For example, if the voltage present on the first voltage node (labeled $V_{DD}$) is 1.8 volts while the second voltage node ($V_{SS}$) is a reference/ground node, the voltage difference is 1.8 volts. However, since the voltage present on the bias node stays within a threshold voltage of a midpoint (i.e. 0.9 volts in this example), receiver circuit 10 may be implemented with transistors having a threshold (i.e. $V_{GS}$) voltage that is less than 1.8 volts. Thus, in this example, receiver circuit 10 could be implemented with input transistors rated to handle a voltage difference of 1.2 volts between the gate and source, even though the voltage swing between a logic high voltage and a logic low voltage is approximately 1.8 volts. This is due to the fact that the voltage between the gate of the input transistors and an associated bias node will be equal to or less than 1.2 volts since the voltage on the associated bias node is within a threshold voltage of the midpoint.

In general, the transistors used in the circuit may be selected for any value where the rated voltage across any two terminals exceeds one half the voltage between the first and second voltage nodes plus the threshold voltage. For the embodiment discussed here, this voltage is $V_{DD}/2+V_{TH}$. This voltage may be less than the maximum voltage swing of an input signal and/or the voltage difference between the first and second voltage nodes. Some transistors having voltage ratings that are less than the voltage difference between the two voltage nodes may have faster switching times than transistors rated to handle a voltage difference that exceeds the voltage difference between the two voltage nodes. Thin oxide FETs (field effect transistors) may be used to implement receiver circuit 10 may be protected from over-voltage conditions due to the maintenance of the specified voltage (midpoint plus or minus $V_{TH}$) on the bias nodes.

In the embodiment shown, receiver circuit 10 also includes a third bias transistor, $Q_5$. The input voltage to transistor $Q_5$, $V_{bias-1}$, is approximately equal to $V_{DD}/2$. Receiver circuit 10 also includes first and second resistors $R_1$ and $R_2$, which are coupled to transistors $Q_3$ and $Q_4$, respectively. Output nodes are present at the junctions between the resistors and the transistors. Due to the cascode topology of receiver circuit 10, the side of the circuit that is on (as defined by either input transistor $Q_1$ or input transistor $Q_2$ being on) acts as an amplifier, with the output taken from the output nodes.

While the embodiment shown in FIG. 1 is implemented with PMOS transistors, with $V_{DD}$ acting as a voltage node while $V_{SS}$ acts as a reference/ground node, other embodiments are possible and contemplated. Such other embodiments include those implemented using NMOS transistors, wherein the polarity between the first ($V_{DD}$) and second ($V_{SS}$) voltage nodes is reversed. Embodiments implemented with bi-polar transistors are also possible and contemplated.

Similar single-ended embodiments are also contemplated. A single-ended embodiment could be implemented using one side of the circuit, with a single input transistor, a single bias transistor, and a single current source (e.g., $Q_1$, $Q_3$, and $I_1$). The output of such an embodiment may be taken across a resistor (e.g., $R_1$), and single ended implementations of the circuit may also include a bias transistor analogous to bias transistor $Q_5$. The general principle of operation of a single-ended embodiment may include the current source coupled to provide current to a bias node, wherein the current source is configured to supply current in order to maintain a voltage on the bias node that is within a threshold voltage of a midpoint between voltages present on first and second voltage nodes. Bias transistors in the circuit may be coupled to receive bias voltages in a similar manner as the circuit illustrated in FIG. 1. As with the differential embodiments discussed above, embodiments of a single-ended circuit implemented with either PMOS or NMOS transistors and with the appropriate polarity between $V_{DD}$ and $V_{SS}$ are also possible and contemplated.

Figure 2:
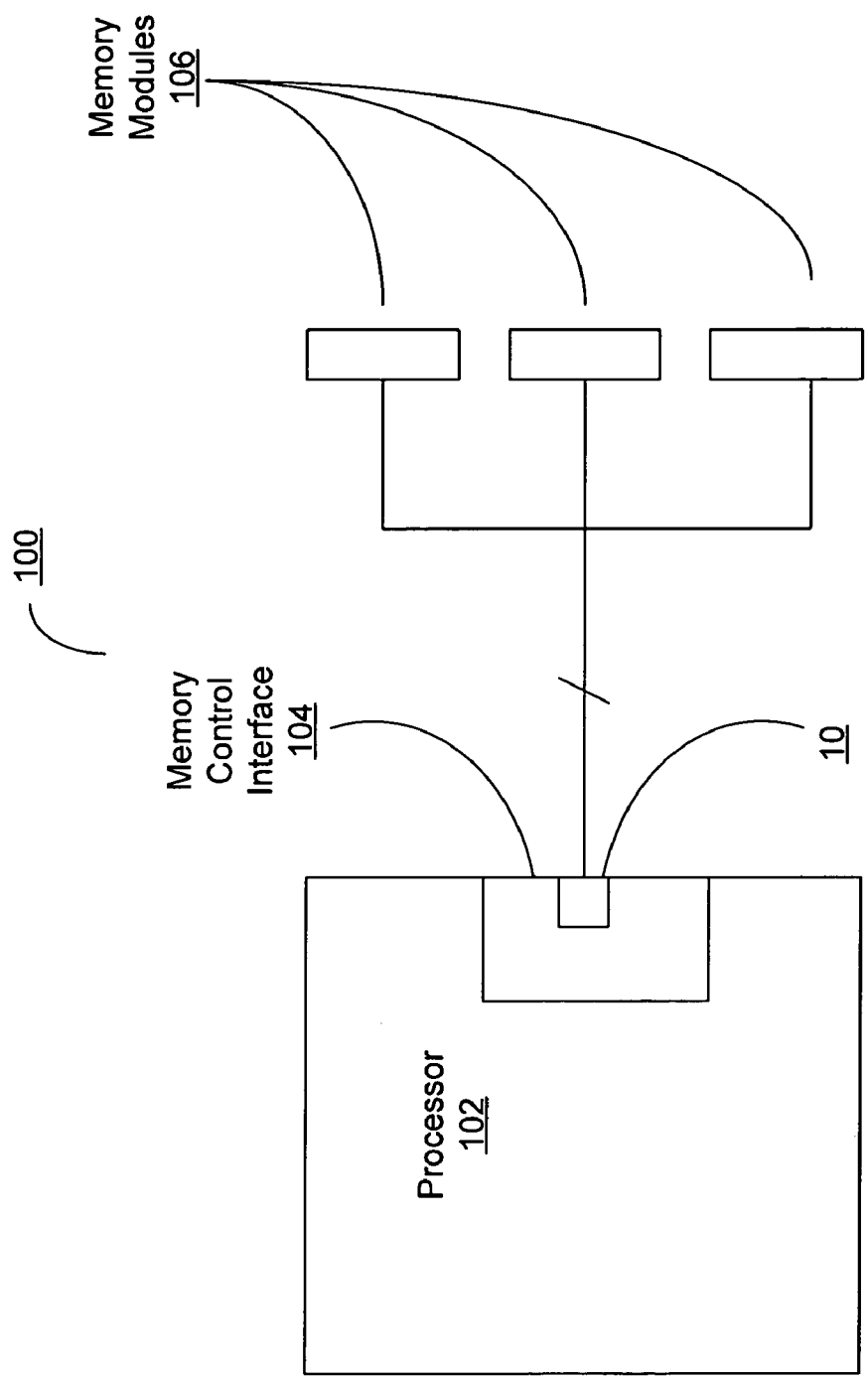
FIG. 2 is a block diagram of one embodiment of an electronic system.

FIG. 2 is a block diagram of one embodiment of an electronic system. In the embodiment shown, electronic system 100 includes processor 102, which is coupled to a plurality of memory modules 106. More particularly, processor 102 includes a memory control interface 104, which in turn includes a receiver circuit 10. The embodiment of receiver circuit 10 implemented in memory control interface 104 may be any of the receiver circuit embodiments discussed above in reference to FIG. 1. Thus, memory control interface 104 is coupled to receive signal from memory modules 106 via receiver circuit 10. The memory modules 106 and memory control interface 104 may conform to various specifications, such as the DDR2 (double data rate) memory specification.

It should be noted that the embodiment of electronic system 100 shown in FIG. 2 is exemplary, and that the receiver circuits discussed herein may be implemented in a wide variety of electronic systems other than the one discussed here.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A differential receiver circuit:
   a first input transistor, wherein a first terminal of the first input transistor is coupled to a first bias node
   a second input transistor, wherein a first terminal of the second input transistor is coupled to a second bias node;
   a first bias transistor, wherein a first terminal of the first bias transistor is coupled to the first bias node;
   a second bias transistor, wherein a first terminal of the second bias transistor is coupled to the second bias node;
   a first current source coupled to provide current to the first bias node; and
   a second current source coupled to provide current to the second bias node;
   wherein the differential receiver circuit is coupled to a first voltage node and a second voltage node, wherein the first and second current sources are coupled to provide current to the first and second bias nodes, respectively, such that the voltage present on the first and second bias nodes remains within approximately a threshold voltage of a midpoint between a voltage present on the first voltage node and a voltage present on the second voltage node.

2. The differential receiver circuit as recited in claim 1, wherein a maximum rated voltage difference across any transistor in the differential receiver circuit is less than a voltage difference between the voltage present on the first voltage node and the voltage present on the second voltage node.

3. The differential receiver circuit as recited in claim 1, wherein an input voltage on a gate terminal of each of the first and second bias transistors is within approximately the threshold voltage of the midpoint between the voltage present on the first voltage node and the voltage present on the second voltage node.

4. The differential receiver circuit as recited in claim 3, wherein the gate terminal of each of the first and second bias transistors are coupled together.

5. The differential receiver circuit as recited in claim 1, wherein the differential receiver circuit includes a third bias transistor, wherein the third bias transistor is coupled between the first voltage node and a second terminal of each of the first and second input transistors.

6. The differential receiver circuit as recited in claim 5, wherein a gate terminal of the third bias transistor is coupled to receive a voltage that is at approximately the midpoint between the voltage present on the first voltage node and the voltage present on the second voltage node.

7. The differential receiver circuit as recited in claim 1, wherein the differential receiver circuit includes a first output node coupled to a second terminal of the first bias transistor and a second output node coupled to a second node of the second bias transistor.

8. The differential receiver circuit as recited in claim 7, wherein the differential receiver circuit includes a first resistor coupled between the first output node and the second voltage node and a second resistor coupled between the second output node and the second voltage node.

9. The differential receiver circuit as recited in claim 1, wherein the voltage present on the first voltage node is greater than the voltage present on the second voltage node.

10. The differential receiver circuit as recited in claim 9, wherein first and second input transistors and the first and second bias transistors are PMOS transistors.

11. The differential receiver circuit as recited in claim 1, wherein the voltage present on the first voltage node is less than the voltage present on the second voltage node.

12. The differential receiver circuit as recited in claim 11, wherein first and second input transistors and the first and second bias transistors are NMOS transistors.

13. A differential receiver circuit comprising:
   a first input transistor and a second input transistor, wherein a drain terminal of the first input transistor is coupled to a first bias node and a drain terminal of the second input transistor is coupled to a second bias node;
   a first bias transistor having a source terminal coupled to the first bias node;
   a second bias transistor having a source terminal coupled to the second bias node;
   a first current source coupled to provide current to the first bias node; and
   a second current source coupled to provide current to the second bias node;
   wherein the differential receiver circuit is coupled to a voltage node and a reference node and wherein each of the first and second current sources are configured to provide current to the first and second bias nodes respectively such that the voltage on each of the first and second bias node remains within approximately a threshold voltage amount of one half a voltage present on the voltage node.

14. The differential receiver circuit as recited in claim 13, wherein a maximum gate-source voltage across any transistor in the differential receiver circuit is less than a difference between the voltage present on the voltage node and a voltage present on the reference node.

15. The differential receiver circuit as recited in claim 13, wherein an input voltage on a gate terminal of each of the first and second bias transistors is approximately one half the voltage present on the voltage node minus the threshold voltage.

16. The differential receiver circuit as recited in claim 15, wherein the gate terminal of each of the first and second bias transistors are coupled together.

17. The differential receiver circuit as recited in claim 13, wherein the differential receiver circuit includes a third bias transistor, wherein the third bias transistor having a source terminal coupled to the voltage node and a drain terminal coupled to the source terminals of each of the first and second input transistors.

18. The differential receiver circuit as recited in claim 17, wherein a gate terminal of the third bias transistor is coupled to receive a voltage that is approximately one half of the voltage present on the voltage node.

19. The differential receiver circuit as recited in claim 13, wherein the differential receiver circuit includes a first output node coupled to a drain terminal of the first bias transistor and a second output coupled to a drain terminal of the second bias transistor.

20. The differential receiver circuit as recited in claim 19 further comprising a first resistor coupled between the first output node and the reference node and a second resistor coupled between the second output node and the reference node.

21. A circuit comprising:
   an input transistor, wherein a first terminal of the input transistor is coupled to a first bias node;
   a first bias transistor, wherein a first terminal of the bias transistor is coupled to the first bias node; and a current source coupled to provide current to the first bias node;

wherein the circuit is coupled to a first voltage node and a second voltage node, wherein the current source is configured to provide current to the bias node such that the voltage present on the bias node remains within approximately a threshold voltage of a midpoint between a voltage present on the first voltage node and a voltage present on the second voltage node.

22. The circuit as recited in claim 21, wherein a maximum rated voltage across any transistor in the circuit is less than a difference in the voltage present on the first voltage node and the voltage present on the second voltage node.

23. The circuit as recited in claim 21, wherein an input voltage on a gate terminal of the bias transistor is within approximately a threshold voltage of the midpoint between the voltage present on the first voltage node and the voltage present on the second voltage node.

24. The circuit as recited in claim 1, wherein the circuit includes a second bias transistor, wherein the second bias transistor is coupled between the first voltage node and a second terminal of the input transistor.

25. The circuit as recited in claim 24, wherein the third bias transistor includes a gate terminal coupled to receive a voltage that is at approximately the midpoint between the voltage present on the first voltage node and the voltage present on the second voltage node.

26. The circuit as recited in claim 21, wherein the circuit includes an output node coupled to a second terminal of the bias transistor.

27. The circuit as recited in claim 26, wherein the circuit includes a resistor coupled between the output node and the second voltage node.

28. The circuit as recited in claim 21, wherein the voltage present on the first voltage node is greater than the voltage present on the second voltage node.

29. The circuit as recited in claim 28, wherein the input transistor and the first bias transistor are PMOS transistors.

30. The circuit as recited in claim 21, wherein the voltage present on the first voltage node is less than the voltage present on the second voltage node.

31. The circuit as recited in claim 30, wherein the input transistor and the first bias transistor are NMOS transistors.

* * * * *